(12) United States Patent
Lewis (10) Patent No.: US 11,606,874 B2
(45) Date of Patent: Mar. 14, 2023

(54) TOLERANCE ABSORBING LEVER MECHANISM

(71) Applicant: DELL PRODUCTS, LP, Round Rock, TX (US)

(72) Inventor: Jeffrey M. Lewis, Maynard, MA (US)

(73) Assignee: Dell Products L.P., Round Rock, TX (US)

( * ) Notice: Subject to any disclaimer, the term of this patent is extended or adjusted under 35 U.S.C. 154(b) by 141 days.

(21) Appl. No.: 17/205,006

(22) Filed: Mar. 18, 2021

(65) Prior Publication Data

US 2022/0304177 A1 Sep. 22, 2022

(51) Int. Cl.
 *H05K 7/14* (2006.01)
 *G06F 1/18* (2006.01)

(52) U.S. Cl.
 CPC ........... *H05K 7/1409* (2013.01); *G06F 1/186* (2013.01)

(58) Field of Classification Search
 CPC .............................. H05K 7/1409; G06F 1/186
 See application file for complete search history.

(56) References Cited

U.S. PATENT DOCUMENTS

| 5,414,594 | A | * | 5/1995 | Hristake | H05K 7/1409 439/153 |
| 5,629,836 | A | * | 5/1997 | Wright | H05K 7/1409 361/755 |
| 9,295,178 | B1 | * | 3/2016 | Aldea | F16B 2/10 |
| 9,810,422 | B2 | | 11/2017 | Su et al. | |
| 9,841,790 | B2 | | 12/2017 | Lin et al. | |

* cited by examiner

*Primary Examiner* — James Wu
(74) *Attorney, Agent, or Firm* — Larson Newman, LLP (57) ABSTRACT

A locking mechanism for a device assembly in an information handling system is disclosed. The locking mechanism includes a bulkhead, a compression spring, a leaf spring, and a lever. The compression spring is located within a cavity of the first portion of the bulkhead. A first end of the compression spring is located beyond a surface of the first portion when the compression spring is in a first position. An end of the leaf spring is in physical communication with the first end of the compression spring. The lever is in physical communication with the second portion of the bulkhead and includes an outer surface in physical communication with the leaf spring. When the lever interfaces with a portion of the information handling system and the lever is in a locked position, a connector of an electronic board is fully mated with a connector of the information handling system.

20 Claims, 6 Drawing Sheets

TOLERANCE ABSORBING LEVER MECHANISM

FIELD OF THE DISCLOSURE

The present disclosure generally relates to information handling systems, and more particularly relates to a tolerance absorbing lever mechanism.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs, and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A locking mechanism for a device assembly in an information handling system is disclosed. The locking mechanism includes a bulkhead, a compression spring, a leaf spring, and a lever. The compression spring may be located within a cavity of the first portion of the bulkhead. A first end of the compression spring may be located beyond a surface of the first portion when the compression spring is in a first position. A first end of the leaf spring is in physical communication with and secured to a first portion of the bulkhead, and the second end of the leaf spring may be in physical communication with the first end of the compression spring. The lever may be in physical communication with the second portion of the bulkhead and includes an outer surface in physical communication with the leaf spring. When the lever interfaces with a portion of the information handling system and the lever is in a locked position, a connector of an electronic board may be fully mated with a connector of the information handling system.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
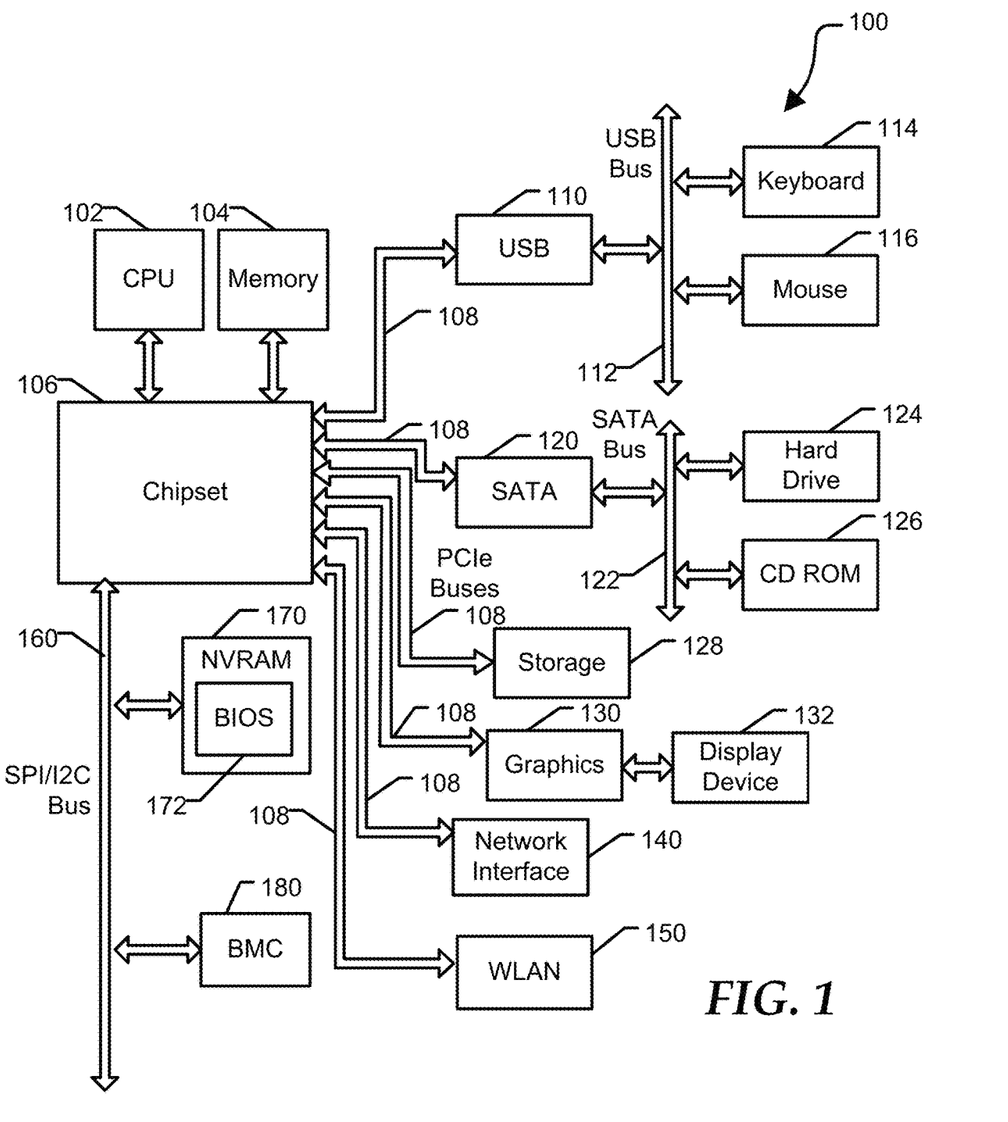
FIG. 1 is a block diagram of a general information handling system according to at least one embodiment of the present disclosure.

FIG. 1 illustrates a general information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more busses operable to transmit communications between the various hardware components.

Information handling system 100 including a processor 102, a memory 104, a chipset 106, one or more PCIe buses 108, a universal serial bus (USB) controller 110, a USB bus 112, a keyboard device controller 114, a mouse device controller 116, a configuration a SATA bus controller 120, a SATA bus 122, a hard drive device controller 124, a compact disk read only memory (CD ROM) device controller 126, a storage 128, a graphics device controller 130, a network interface controller (NIC) 140, a wireless local area network (WLAN) or wireless wide area network (WWAN) controller 150, a serial peripheral interface (SPI) bus 160, a NVRAM 170 for storing BIOS 172, and a baseboard management controller (BMC) 180. In an example, chipset 106 may be directly connected to an individual end point via a PCIe root port within the chipset and a point-to-point topology as shown in FIG. 1. BMC 180 can be referred to as a service processor or embedded controller (EC). Capabilities and functions provided by BMC 180 can vary considerably based on the type of information handling system. For example, the term baseboard management system is often used to describe an embedded processor included at a server, while an embedded controller is more likely to be found in a consumer-level device. As disclosed herein, BMC 180 represents a processing device different from CPU 102, which provides various management functions for information handling system 100. For example, an embedded controller may be responsible for power management, cooling management, and the like. An embedded controller included at a data storage system can be referred to as a storage enclosure processor.

System 100 can include additional processors that are configured to provide localized or specific control functions, such as a battery management controller. Bus 160 can include one or more busses, including a SPI bus, an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 can be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally provides an abstraction layer for the hardware, such as a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and redundant bus controllers. One or more components can be integrated together. For example, portions of chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display. An example of information handling system 100 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Figure 2:
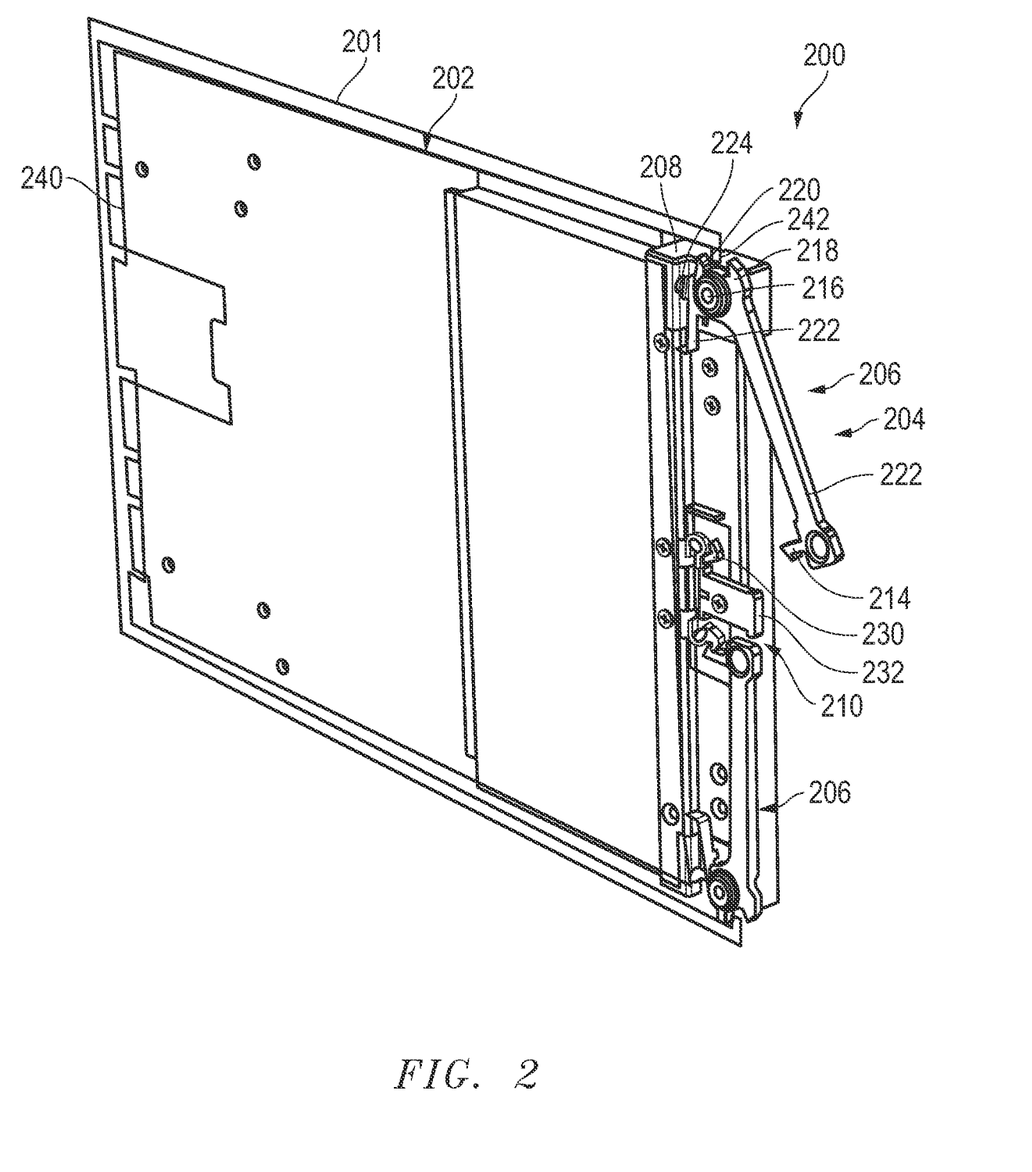
FIG. 2 is a diagram of a device assembly of an information handling system according to at least one embodiment of the disclosure.

In an example, information handling system 100 may include any suitable device including, but not limited to, device assembly 200 of FIG. 2. Information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video, or data communication. Further, while a single information handling system 100 is illustrated, the term "system" shall also be taken to include any collection of systems or sub-systems that individually or jointly execute a set, or multiple sets, of instructions to perform one or more computer functions.

FIG. 2 illustrates a device assembly 200 and a portion of an information handling system 201 according to at least one embodiment of the disclosure. In an example, information handling system 201 may be any suitable information handling system including, but not limited to, such as information handling system 100 of FIG. 1. Device assembly 200 includes electrical board 202 and a locking mechanism 204. In an example, electrical board 202 may be any suitable board to connect with and communication with an information handling, such as information handling system 100 of FIG. 1. For example, electrical board 202 may be a printed circuit board (PCB), a field replaceable unit (FRU), or the like. Locking mechanism 204 includes lever mechanisms 206, a bulkhead 208, and a lever latch 210. In certain examples, lever mechanisms 206 may be in physical communication with and secured to bulkhead 208. In an example, lever mechanisms 206 may be substantially similar. Therefore, for clarity and brevity the description of locking mechanism 204 will be described with respect to only one of lever mechanisms 206. Lever mechanism 206 includes a lever 212, a hook 214, a pivot point 216, a release tab 218, a latching tab 220, a leaf spring 222, and a compression spring 224. Lever latch 210 includes a lock 230 and a release button 232. Information handling system 201 includes a connector 240 and a locking tab 242. In an example, information handling system 201 may include additional components over those shown in FIG. 2 without varying from the scope of this disclosure.

Electrical board 202 may be inserted within any suitable device including, but not limited to, a computer or information handling system enclosure. In an example, the interface between electrical board 202 and connector 240 of information handling system 201 may be a blind electrical connection. In certain examples, a connector of electrical board 202 and connector 240 may need to be fully mated, such that there are no separation gaps between the two connectors. In previous information handling systems, lever mechanisms may be utilized to install an electrical device within an enclosure and mate electrical connectors. However, mechanical tolerances, or differences, between one connector and the next may prevent previous electrical boards from both being fully mated with a connector of the information handling system and the lever mechanism being fully seated/latched at the same time. Locking mechanism 204 improves electrical board 202 and information handling system 201 by absorbing or adjusting to all tolerances between the electrical board and connector 240. For example, pivot point 216 may have a range of motion within locking mechanism 204, such that the locking mechanism may be simultaneously fully latched while the connector of electrical board 202 is fully mated with connector 240 irrespective of the mechanical tolerance of the enclosure of information handling system 201.

In an example, device assembly 200 may be inserted within any suitable information handling system, such as server or the like. In certain examples, connector 240 may be mounted on any suitable component of information handling system 201 including, but not limited to, a compute board, and a fixed midplane.

In an example, if connector 240 is mounted on a midplane, a compute node may be plugged into one side of the connector and device assembly 200 may plug into the other side of the connector. In this example, connector 240 may be fixed reference point for electrical device 202 to mate with. In an example, different connectors in difference information handling systems may have slightly different tolerances and locking mechanism 204 of device assembly 200 may adjust to accommodate the different connectors of difference information handling systems.

In certain examples, as lever 212 rotates around pivot point 216, hook 214 may be inserted within lever latch 210 and be placed in physical communication with lock 230 of the lever latch. In response to hook 214 being secured within lock 230, lever 210 may hold device assembly 200 within an information handling system. In certain examples, in response to lever 212 being pushed to insert hook 214 within lock 230, latching tab 220 may interface with locking tab 242 of information handling system 201 to ensure electrical board 202 is fully mated with connector 240. In an example, a user may press release button 232, which in turn may disengage hook 214 from lock 230. In response to the disengaging of lock 230 from hook 214, lever 212 may rotate and release tab 218 may exert a force on locking tab 242 to release device assembly 200 from information handling system 201.

In an example, leaf spring 222 may be secured to bulkhead 208, and the leaf spring may be utilized as a smooth rubbing surface between lever 212 and compression spring 224. Compression spring 224 is located in between bulkhead 208 and leaf spring 222, and the compression spring may be utilized to control the placement of pivot point 216 with respect to the bulkhead as will be described with respect to FIGS. 3-10 below.

Figure 3:
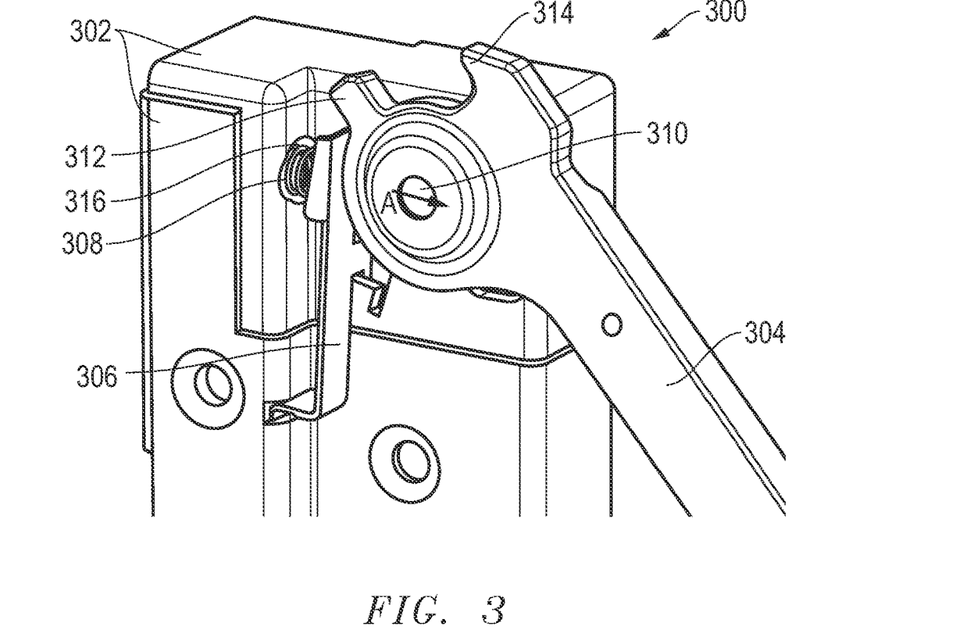
FIG. 3 is a diagram of a portion of a locking mechanism for the device assembly with a lever in an unlocked position according to at least one embodiment of the disclosure.

FIGS. 3-10 illustrate different views of a portion of a locking mechanism 300 for a device assembly, such as device assembly 200 of FIG. 2, according to at least one embodiment of the disclosure. Referring now to FIG. 3, locking mechanism 300 includes a bulkhead 302, a lever 304, a leaf spring 306, compression spring 308, a pivot point 310, a latching tab 312, and a release tab 314. In an example, bulkhead 302 may be placed in physical communication with and secured to a printed circuit board, such as electrical board 202 of FIG. 2. Compression spring 308 is located within a cavity 316 of bulkhead 302 and may be positioned in between the bulkhead and leaf spring 306.

In certain examples, different types of compression springs 308 may be inserted within cavity 316. The different types of compression springs 308 may have different compression strengths, and the different strengths may provide different amounts of force on pivot point 310 of lever 304. In an example, the different compression strengths may enable locking mechanism 300 to provide varying tolerance-absorbing capabilities. In certain examples, the different strengths of compression spring 308 may be set based on any suitable component of the compression spring including, but not limited to, a diameter of the wire of the compression spring, and the number of coils in the compression spring.

The force exerted by compression spring 308 may be transferred to lever 304 via leaf spring 306, and the force may push pivot point 310 in the direction of arrow A in FIG. 3. A resting or biased position of lever 304 may be provided by the combination of compression spring 308 and leaf spring 306. In an example, leaf spring 306 may provide an additional force to lever 304 over the force from compression spring 308. This additional force may be any suitable force, such as a force less than the force of compression spring 308. In certain examples, the force of leaf spring 306 may be controlled by any suitable component of the leaf spring including, but not limited to, the length, thickness, and pre-sprung amount of the leaf spring.

In an example, one end of leaf spring 306 is attached to bulkhead 302 and another end or spring portion of the leaf spring may be in physical communication with and adjacent to an outer circular pivoting surface of lever 304. Leaf spring 306 may provide a smooth conduit (or rubbing surface) between the rotating surface of lever 304 and an end of compression spring 308. In an example, the spring portion of leaf spring 306 may provide a rubbing surface for lever 304. In certain examples, if leaf spring 306 were not present, the end of compression spring 308 may be in physical communication with the rotating surface of lever 304, such that the rotating surface of the lever may not slide or rotate well. For example, the rotating surface of lever 304 may catch on compression spring 308, which may increase a resistance on rotating the lever.

In certain examples, release tab 314 may extend above bulkhead 302 and latching tab 312 may be below the bulkhead while lever 304 is in the resting position. In this configuration, locking mechanism 300 may enable device assembly 200 of FIG. 2 to be inserted within any suitable information handling system, such as information handling system 201 of FIG. 1. Upon device assembly 200 being fully inserted with an information handling system, lever 304 of locking mechanism 300 may rotated to lock device assembly 200 within the information handling system. For example, rotation of lever 304 may cause latching tab 312 to exert a force on a locking tab of an information handling system, such as locking tab 242 of information handling system 201 of FIG. 2.

Figure 4:
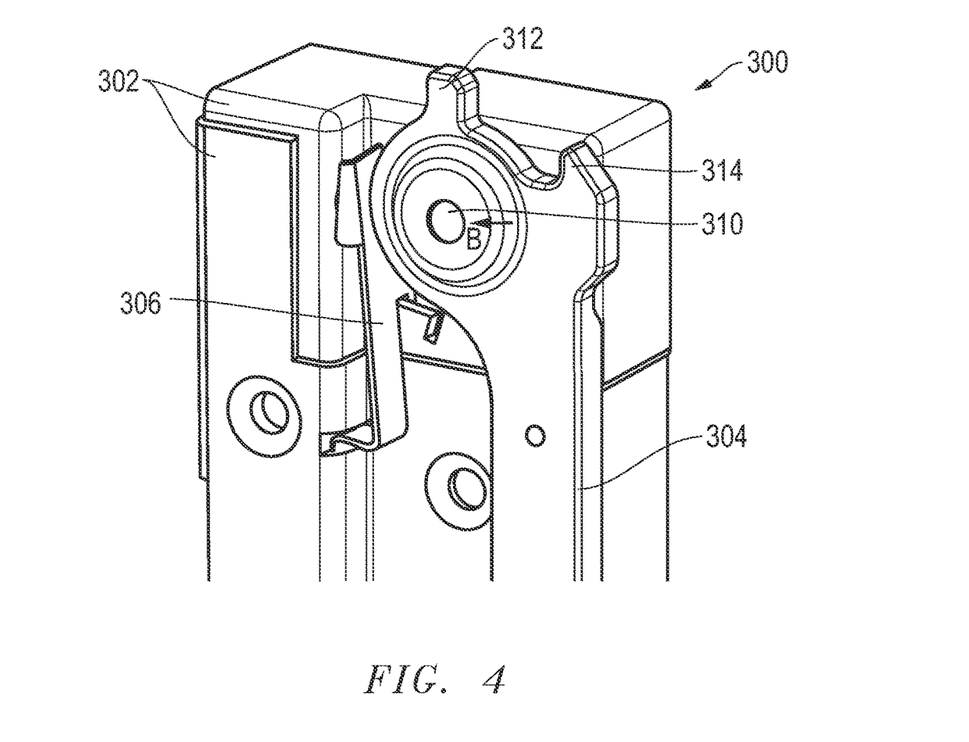
FIG. 4 is a diagram of the portion of the locking mechanism with the lever in a locked position according to at least one embodiment of the present disclosure.

Referring now to FIG. 4, as lever 304 rotates along leaf spring 306, latching tab 312 may rotate above bulkhead 302 and engage with a portion of the information handling system to lock device assembly 200 within the information handling system. As latching tab 312 engages with a portion of the information handling system, pivot point 310 may be pulled toward leaf spring 306 and a portion of bulkhead 302 including compression spring 308. In an example, the force between latching tab 312 and the information handling system may be greater than the force of compression spring 308, such that pivot point 310 is pulled in the direction of arrow B. In this example, leaf spring 306 may be compressed toward bulkhead 302 based on an amount of force exerted on latching tab 312 by the information handling system. The movement of lever 304 with respect to bulkhead 302 may enable locking mechanism 300 provide an amount tolerance for differences from one information handling system to the next with respect to how the information handling systems interface with device assembly 200.

Figure 5:
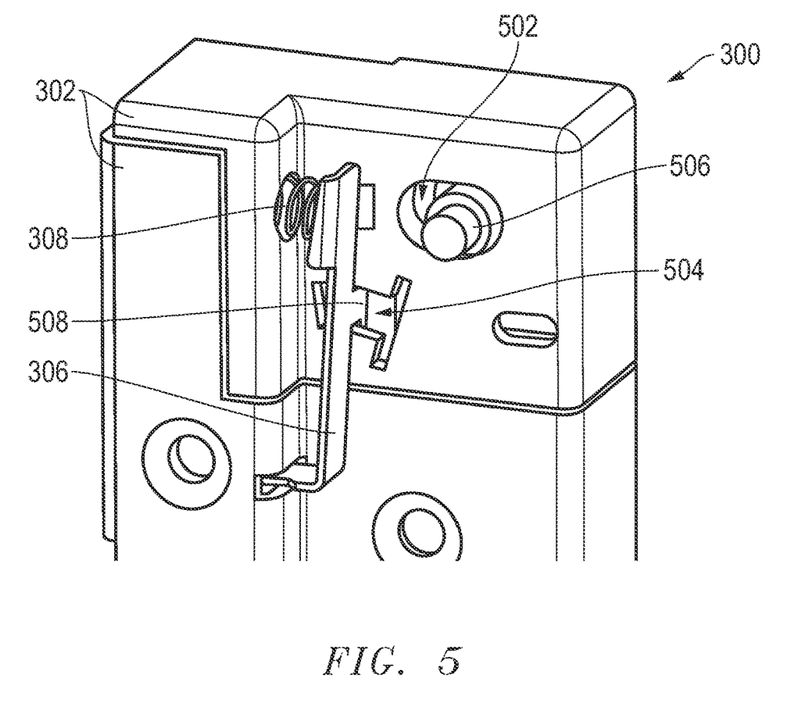
FIG. 5 is a diagram of the portion of the locking mechanism with the lever removed according to at least one embodiment of the present disclosure.
Figure 6:
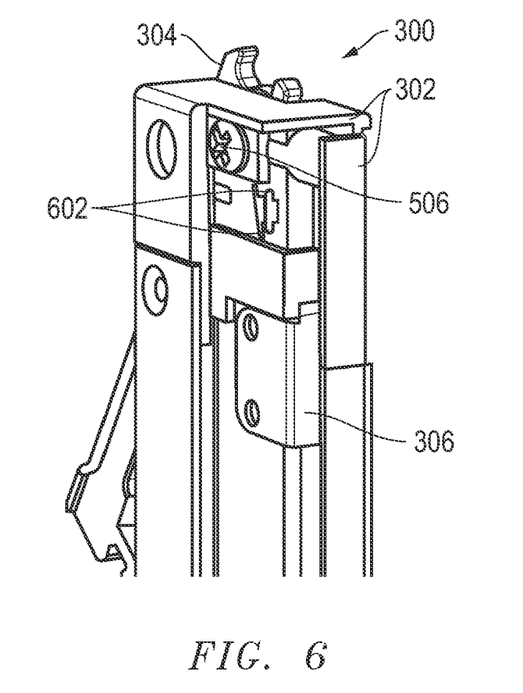
FIG. 6 is a diagram of a backside of the locking mechanism according to at least one embodiment of the present disclosure.

Referring now to FIGS. 5 and 6, locking mechanism 300 includes slot 502 and 504, a mounting component 506, and a tab 508. In an example, slot 502 may extend through bulkhead 302 and may enable mounting component 506 to move or slide with respect to bulkhead 302. Slot 504 is located within bulkhead 302 and may allow movement or compression of leaf spring 306 towards or away from a portion of the bulkhead that includes compression spring 308. Mounting component 506 may extend through bulkhead 302 and may attach lever 304 to locking mechanism 300. In an example, mounting component 506 may be any suitable device to hold lever 304 and to slide within slot 502 including, but not limited to, a shoulder screw. In certain examples, tab 508 of leaf spring 306 may extend through slot 504, and wings 602 of the tab may hold the leaf spring in close proximity to bulkhead 302. Tab 508 may be any suitable component including, but not limited to, a keyway tab.

In an example, mounting component 506 may be located anywhere within slot 502. For example, mounting component 506 may be located at one extreme end of slot 502 when lever 304 is in a resting position, and may be located at an opposite extreme end of the slot when the lever is in a locked position with an information handling system offset at the maximum tolerance of locking mechanism 300. In an example, mounting component 506 may move or transition along slot 502 as lever 304 is placed in physical communication with an information handling system to secure device assembly 200 of FIG. 2 within the information handling system. The exact position or location of mounting component 506 depends on an offset of a current information handling system device assembly 200 of FIG. 2 is inserted within. For example, the larger offset from a standard location of mounting features of the information handling system, the further away mounting component 506 is from the resting extreme end of slot 502.

In certain examples, tab 508 of leaf spring 306 may enable the leaf spring to slide within slot 504 without the leaf spring pulling or floating away from bulkhead 302. For example, wings 602 of tab 508 maintain the position of leaf spring 306 with respect to one surface of bulkhead 302. However, the remaining portion of tab 508 may enable leaf spring 306 to compress and release compression spring 308 based on movement of the leaf spring within slot 504. The movement of leaf spring 306 within slot 504 may be based on a force exerted on the leaf spring from lever 304. In an example, leaf spring 306 may be connected to a backside of bulkhead 302 and extend through to a front side of the bulkhead to interface with lever 304 and compression spring 308.

Figure 7:
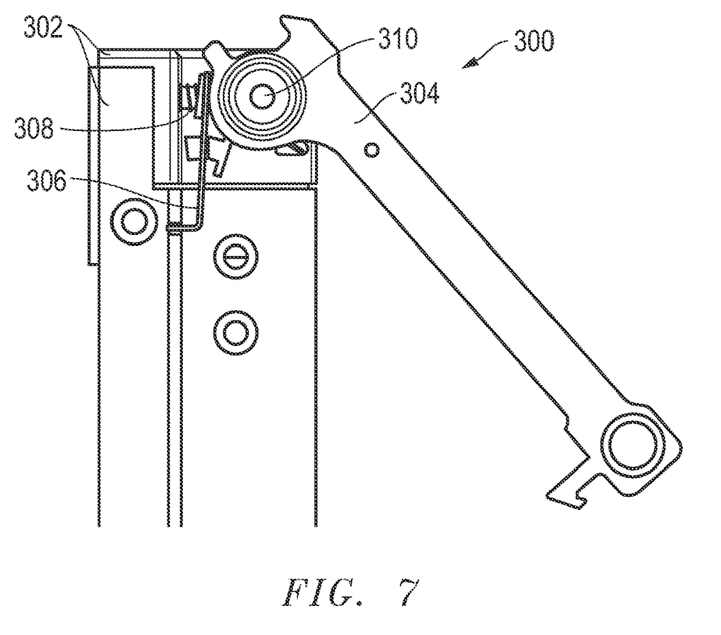
FIG. 7 is a side view of the locking mechanism with the lever in the unlocked position according to at least one embodiment of the present disclosure.
Figure 8:
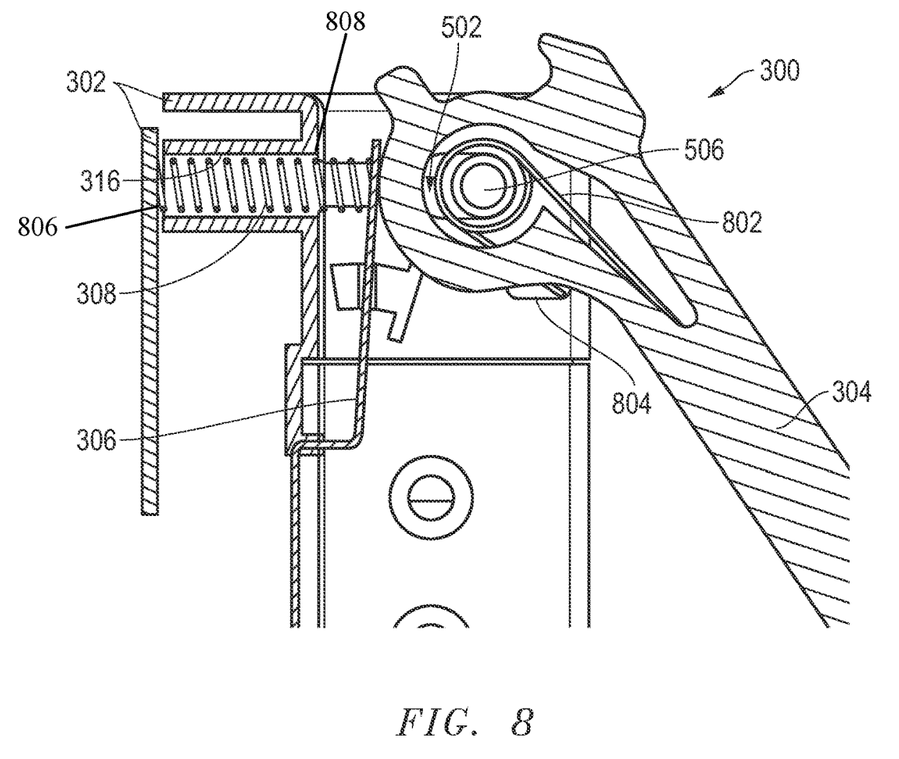
FIG. 8 is a cross sectional view of the locking mechanism with the lever in the unlocked position according to at least one embodiment of the present disclosure.

Referring now to FIGS. 7 and 8, lever 304 is in the resting or unlocked position. In the resting position, compression spring 308 may exert a force on leaf spring 306, which in turn may exert the force on lever 304 to bias the lever toward a first extreme end of slot 502. For example, compression spring 308 may extend from cavity 316 within a portion of bulkhead 302 and may push or bias lever 304 away from this portion of the bulkhead.

FIG. 8 illustrates a cross section of locking mechanism 300 according to at least one embodiment of the disclosure. In an example, a spring 802 may be utilized in any suitable manner to bias lever 304 in an open position. Spring 802 may be in physical communication with bulkhead 302 and with lever 304. For example, one end of spring 802 may be placed within a notch 804 of bulkhead 302 and in physical communication with a surface 806 of the bulkhead, and the other end of the spring may extend beyond a surface 808 of the bulkhead and be in physical communication with lever 304. In an example, spring 802 may exert a force on lever 304 to bias the lever upward and away from notch 804. Spring 804 may be any suitable type of spring including, but not limited to, a hairpin spring. In certain examples, mounting component 506 may extend substantially through the center of spring 802, which may enable the mounting component to be pivot point 310 of lever 304.

Figure 9:
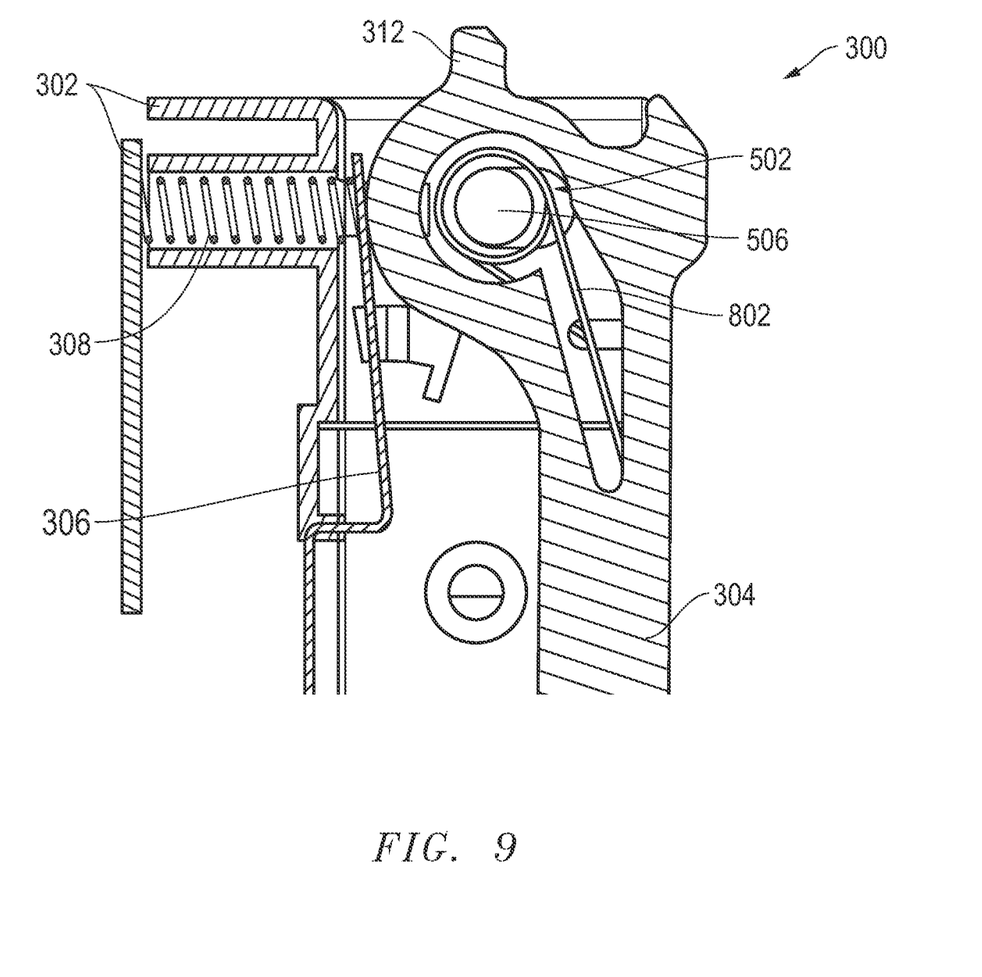
FIG. 9 is a cross sectional view of the locking mechanism with the lever in the locked position according to at least one embodiment of the present disclosure.

Referring now to FIG. 9, a cross section of locking mechanism 300 is illustrated showing lever 304 in the locked position according to at least one embodiment of the disclosure. In an example, as lever 304 is rotated from the open to the locked position, latching tab 312 may interface with a portion of an information handling system to secure device assembly 200 of FIG. 2 within the information handling system. In certain examples, based on the force utilized to rotate lever 304 being greater than a force of spring 802, the spring may be compressed as shown in FIG. 9.

As described above, the interface between latching tab 312 and a portion of the information handling system may exert a force on lever 304. In an example, this force may cause mounting component 506 to slide to an extreme end of slot 502. As mounting component 506 slides within slot 502, lever 304 may also move toward the portion of bulkhead 302 housing compression spring 308. This movement of lever 304 may exert a force to compress both leaf spring 306 and compression spring 308 as shown in FIG. 9.

As described herein, bulkhead 302, lever 304, leaf spring 306, compression spring 308, slot 502, mounting 506, and other components of locking mechanism may combine to improve device assembly 200 of FIG. 2. For example, locking mechanism 300 may overcome different mechanical tolerances, or differences, between one connector and the next to enable electrical boards to be both being fully mated with a connector of an information handling system and the locking mechanism to be fully seated/latched at the same time.

While device assembly 200 and locking mechanism 300 have been shown and described in a vertical orientation, one of ordinary skill in the art would recognize that these components may be positioned in any direction, such as a horizontal position, and operate as disclosed above and without varying from the scope of this disclosure.

Referring back to FIG. 1, the information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A locking mechanism for a device assembly in an information handling system, the locking mechanism comprising:
    a bulkhead including first and second portions;
    a compression spring located within a cavity of the first portion of the bulkhead, a first end of the compression spring located beyond a surface of the first portion when the compression spring is in a first position;
    a leaf spring including first and second ends, the first end of the leaf spring in physical communication with and secured to the first portion of the bulkhead, the second end of the leaf spring in physical communication with the first end of the compression spring; and
    a lever in physical communication with the second portion of the bulkhead, the lever including an outer surface in physical communication with the leaf spring, the lever to interface with a portion of the information handling system, such that when the lever is interfaced with the portion of the information handling system and the lever is in a locked position, then a connector of an electronic board is fully mated with a connector of the information handling system.

2. The locking mechanism of claim 1, further comprising:
    a mounting component in physical communication with the second portion of the bulkhead, wherein the mounting component is inserted through a slot of the second portion of the bulkhead and secured to the lever.

3. The locking mechanism of claim 2, wherein the mounting component is secured to the lever at a pivot point of the lever.

4. The locking mechanism of claim 1, wherein the outer surface of the lever slides across the leaf spring when the lever is rotated from an open position to a locked position.

5. The locking mechanism of claim 1, wherein the compression spring biases the mounting component toward a first extreme end of the slot of the second portion of the bulkhead.

6. The locking mechanism of claim 5, wherein the lever further includes:
    a latching tab to interface with the portion of the information handling system, wherein the connector of the electronic board is inserted within the connector of the information handling system as the latching tab exerts a force on the portion of the information handling system.

7. The locking mechanism of claim 6, wherein the mounting component is located at different locations within the slot of the second portion of the bulkhead based on an amount of the force exerted by the latching tab on the portion of the information handling system.

8. The locking mechanism of claim 7, wherein in response to the amount of the force exerted by the latching tab on the portion of the information handling system being greater than a force exerted on the lever by the compression spring, the mounting components to transition from the first extreme end of the slot of the second portion of the bulkhead toward a second extreme end of the slot.

9. A device assembly for an information handling system, the device assembly comprising:
an electronic board including a connector; and
a locking mechanism in physical communication with the electronic board, the locking mechanism including:
a bulkhead including first and second portions;
a compression spring located within a cavity of the first portion of the bulkhead, a first end of the compression spring located beyond a surface of the first portion when the compression spring is in a first position;
a leaf spring including first and second ends, the first end of the leaf spring in physical communication with and secured to the first portion of the bulkhead, the second end of the leaf spring in physical communication with the first end of the compression spring;
a lever in physical communication with the second portion of the bulkhead, the lever including an outer surface in physical communication with the leaf spring, the lever to interface with a portion of the information handling system, such that when the lever is interfaced with the portion of the information handling system and the lever is in a locked position, the connector of the electronic board is fully mated with a connector of the information handling system; and
a spring including first and second ends, the first end of the spring is in physical communication with a notch of the second portion of the bulkhead and the second end of the spring is in physical communication with the lever, the spring to bias the lever towards an open position.

10. The device assembly of claim 9, wherein the locking mechanism further includes:
a mounting component in physical communication with the second portion of the bulkhead, wherein the mounting component is inserted through a slot of the second portion of the bulkhead and secured to the lever.

11. The device assembly of claim 10, wherein the mounting component is secured to the lever at a pivot point of the lever.

12. The device assembly of claim 9, wherein the outer surface of the lever slides across the leaf spring when the lever is rotated from an open position to a locked position.

13. The device assembly of claim 9, wherein the compression spring biases the mounting component toward a first extreme end of the slot of the second portion of the bulkhead.

14. The device assembly of claim 13, wherein the lever further includes:
a latching tab to interface with the portion of the information handling system, wherein the connector of the electronic board is inserted within the connector of the information handling system as the latching tab exerts a force on the portion of the information handling system.

15. The device assembly of claim 14, wherein the mounting component is located at different locations within the slot of the second portion of the bulkhead based on an amount of the force exerted by the latching tab on the portion of the information handling system.

16. The device assembly of claim 15, wherein in response to the amount of the force exerted by the latching tab on the portion of the information handling system being greater than a force exerted on the lever by the compression spring, the mounting components to transition from the first extreme end of the slot of the second portion of the bulkhead toward a second extreme end of the slot.

17. An information handling system comprising:
a compute node including a connector; and
a device assembly including:
an electronic board including a connector; and
a locking mechanism in physical communication with the electronic board, the locking mechanism including:
a bulkhead including first and second portions;
a compression spring located within a cavity of the first portion of the bulkhead, a first end of the compression spring is located beyond a surface of the first portion when the compression spring is in a first position;
a leaf spring including first and second ends, the first end of the leaf spring is in physical communication with and secured to the first portion of the bulkhead, the second end of the leaf spring is in physical communication with the first end of the compression spring; and
a lever in physical communication with the second portion of the bulkhead, the lever including an outer surface in physical communication with the leaf spring, the lever to interface with a portion of the information handling system, when the lever is interfaced with the portion of the information handling system and the lever is in a locked position, the connector of the electronic board is fully mated with the connector of the information handling system.

18. The information handling system of claim 17, wherein the locking mechanism further includes:
a mounting component in physical communication with the second portion of the bulkhead, wherein the mounting component is inserted through a slot of the second portion of the bulkhead and secured to the lever.

19. The information handling system of claim 18, wherein the mounting component is secured to the lever at a pivot point of the lever.

20. The information handling system of claim 17, wherein the compression spring biases the mounting component toward a first extreme end of the slot of the second portion of the bulkhead.

* * * * *